(12) United States Patent
Aigner

(10) Patent No.: US 6,657,363 B1
(45) Date of Patent: Dec. 2, 2003

(54) THIN FILM PIEZOELECTRIC RESONATOR

(75) Inventor: Robert Aigner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/708,278

(22) Filed: Nov. 8, 2000

Related U.S. Application Data

(63) Continuation of application No. PCT/DE99/01393, filed on May 7, 1999.

(30) Foreign Application Priority Data

May 8, 1998 (DE) .......................... 198 20 755

(51) Int. Cl.$^7$ .............................................. H01L 41/08
(52) U.S. Cl. ...................................... 310/324; 310/312
(58) Field of Search ................. 310/312, 321, 310/324, 330

(56) References Cited

U.S. PATENT DOCUMENTS

| | | | |
|---|---|---|---|
| 3,569,750 A | * 3/1971 | Beaver | 310/312 X |
| 4,130,771 A | * 12/1978 | Bottom | 310/312 |
| 4,243,960 A | 1/1981 | White et al. | |
| 4,442,574 A | 4/1984 | Wanuga et al. | |
| 4,447,753 A | * 5/1984 | Ochiai | 310/312 |
| 4,562,370 A | * 12/1985 | Von Dach | 310/312 |
| 4,638,205 A | * 1/1987 | Fujita et al. | 310/312 |
| 4,642,505 A | * 2/1987 | Arvanitis | 310/312 |
| 5,160,870 A | * 11/1992 | Carson et al. | 310/324 X |
| 5,692,279 A | * 12/1997 | Mang et al. | 310/312 X |
| 6,114,795 A | * 9/2000 | Tajima et al. | 310/312 |
| 6,249,074 B1 | * 6/2001 | Zimnicki et al. | 310/312 |
| 6,271,619 B1 | * 8/2001 | Yamada et al. | 310/324 |

FOREIGN PATENT DOCUMENTS

| | | |
|---|---|---|
| DE | 29 05 132 C2 | 4/1988 |
| DE | 37 43 592 A1 | 7/1988 |
| EP | 0 220 320 B1 | 3/1997 |

OTHER PUBLICATIONS

International Publication WO 96/10270 (Zimnicki), dated Apr. 4, 1996.
Woo Wai Lau et al.: "Lateral–Field–Excitation Acoustic Resonators For Monolithic Oscillators and Filters", 1996 IEEE International Frequency Control Symposium, pp. 558–562.
J. L. Hokanson et al.: "Laser–Machining Thin–Film Electrode Arrays on Quartz Crystal Substrates", Journal of Applied Physics, vol. 40, No. 8, pp. 3157–3160.

* cited by examiner

*Primary Examiner*—Mark Budd
(74) *Attorney, Agent, or Firm*—Laurence A. Greenberg; Werner H. Stemer; Ralph E. Locher

(57) ABSTRACT

The layer of the cover electrode, or an additional layer on the cover electrode is formed with holes, preferably produced lithographically, or similar structures. The structures have a mean spacing from one another which is smaller than the wavelength for operating the component. The structures are preferably distributed with a uniformity sufficient to effect a uniform change in the mass of the layer per area, thus producing a specific setting of the resonant frequency/frequencies, and are preferably, on the other hand, distributed so irregularly that diffraction effects are avoided.

5 Claims, 2 Drawing Sheets

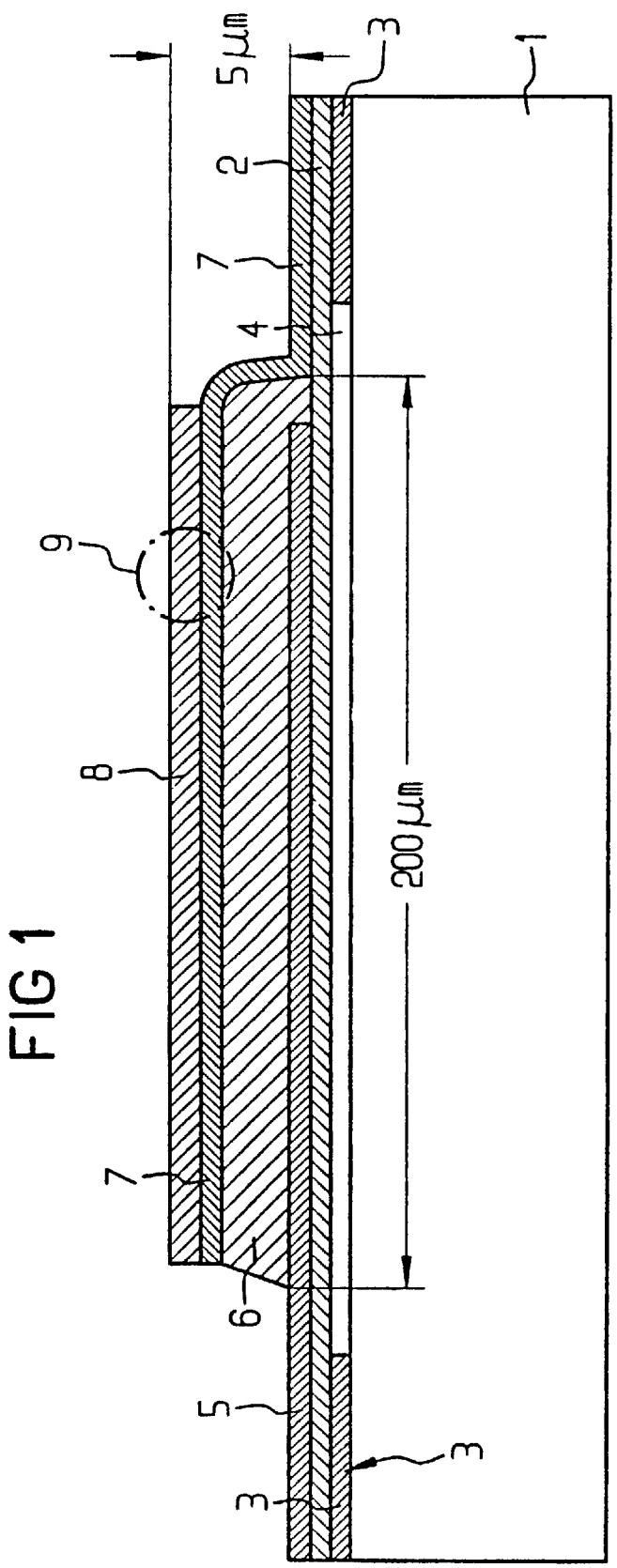

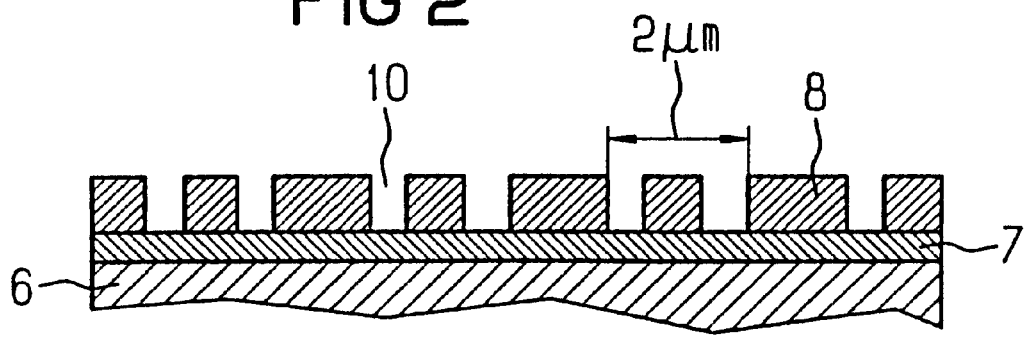
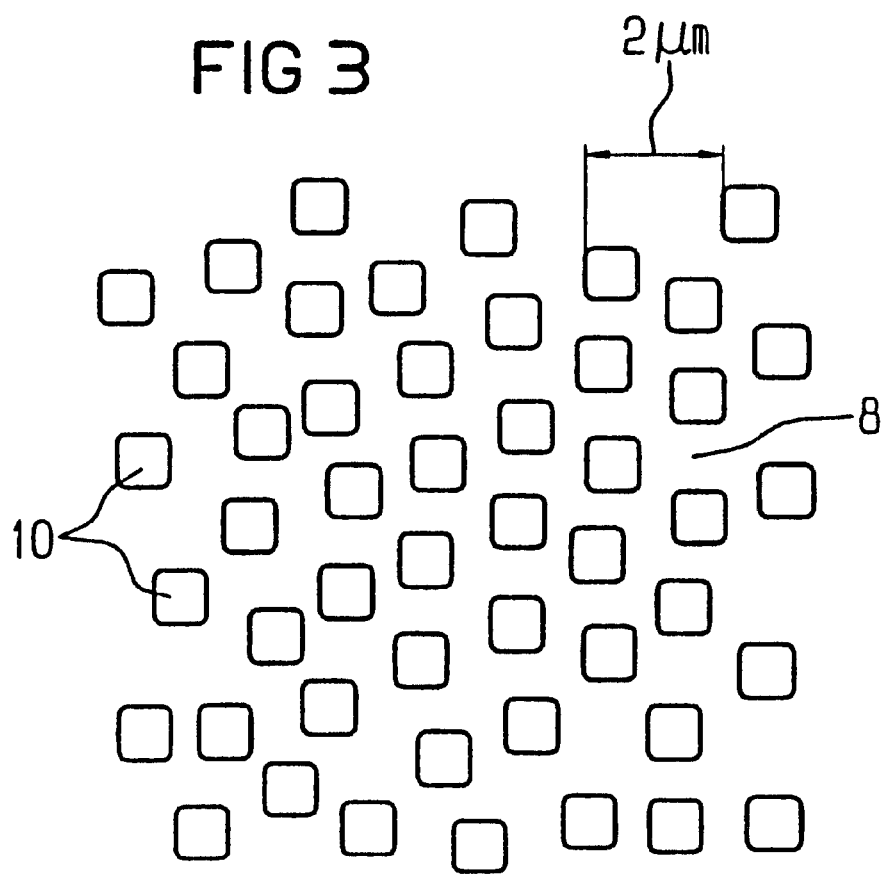

THIN FILM PIEZOELECTRIC RESONATOR

CROSS-REFERENCE TO RELATED APPLICATIONS

This is a continuation of copending International Application PCT/DE99/01393, filed May 7, 1999, which designated the United States.

BACKGROUND OF THE INVENTION

1. Field of the Invention

The present invention relates to a thin film piezoelectric resonator which can be produced using micromechanical methods.

The resonant frequency of thin film piezoelectric resonators in the frequency range above 500 MHz is indirectly proportional to the layer thickness of the piezoelectric layer. The carrier membrane and the bottom and cover electrodes constitute an additional mass loading for the resonator which effects a reduction in the resonant frequency. The thickness fluctuations in all these layers determine the range of manufacturing tolerances in which the resonant frequency of a specimen resonator lies. Layer thickness fluctuations of 5% are typical for sputtering processes in microelectronics. A 1% tolerance can be achieved with a considerable outlay. Fluctuations occur both statistically from wafer to wafer and systematically between the middle of the wafer and the edge. The resonant frequencies of individual resonators must exhibit an absolute accuracy of 0.5% for filters in the GHz range.

A plurality of resonators must be connected in a ladder configuration, lattice configuration, or parallel configuration for highly selected filters. The individual resonators must be detuned specifically relative to one another in order to achieve the desired filter characteristic. It is preferable for reasons of cost to produce all the resonators of a filter from a piezoelectric layer of constant thickness; frequency tuning is performed by additive layers on the cover electrodes. An additional layer of different thickness must be produced for each resonant frequency which occurs. This requires in each case a deposition or an etching step, connected to a lithography step. In order to limit this outlay, it is customary to produce only filter topologies with the aid of which only two resonant frequencies are set.

The resonant frequency of thin film piezoelectric resonators can basically be trimmed by applying additional layers, as described above, but this necessitates expensive lithography. Material can be removed over the entire surface by laser trimming or ion-beam trimming, and this reduces the mass of the cover layer, although necessitating an expensive fabrication step at the end of the fabrication process. It is true that the resonant frequency can be shifted by connecting capacitors or applying a d.c. voltage, but the trimming range is comparatively narrow. The same holds for thermal trimming by heating up the resonator.

2. Summary of the Invention

The object of the invention is to provide a thin film piezoelectric resonator which overcomes the above-noted deficiencies and disadvantages of the prior art devices and methods of this kind, and which can be set to a prescribed resonant frequency using simple means and with high accuracy. It is a further object to specify how a plurality of resonant frequencies can be set in a simple way.

With the above and other objects in view there is provided, in accordance with the invention, a thin film piezoelectric resonator, comprising:

a lower electrode layer and an upper electrode layer;
a piezoelectric layer between the lower electrode layer and the upper electrode layer;
an additional layer disposed on the upper electrode layer, the additional layer having a structure setting a prescribed resonant frequency of the piezoelectric resonator.

In accordance with an added feature of the invention, the additional layer has holes defining the structure, and a spacing between each one of the holes and a respectively closest hole is smaller than a wavelength of an operating wavelength of the resonator.

In accordance with an alternative feature of the invention, the structure in the additional layer is defined by islands. Similarly to above, a spacing between each one of the islands and a respectively closest island is smaller than the resonator operating wavelength.

In accordance with another feature of the invention, the structure is defined in such irregular distribution and dimensioning that diffraction phenomena are avoided.

In accordance with a further feature of the invention, the piezoelectric layer is formed of AlN, ZnO, or PZT ceramic.

In accordance with a concomitant feature of the invention, a carrier film of polysilicon is disposed below the lower electrode layer, the piezoelectric layer, and the upper electrode layer, and wherein a cavity is formed on a side of the carrier film averted from the lower electrode layer.

With the above and other objects in view there is also provided, in accordance with the invention, a piezoelectric resonator assembly, comprising a plurality of thin film piezoelectric resonators as outlined above. These thin film resonators are formed on a common chip and they are set to at least three different resonant frequencies.

In summary, the thin film piezoelectric resonator of the invention has, in the layer of the cover electrode, or in an additional layer specifically applied therefor, holes, preferably produced lithographically, or similar structures. The structures have a mean spacing from one another which is smaller than the acoustic wavelength provided during operation of the component. These structures are preferably distributed with a uniformity that is sufficient to effect a uniform change in the mass of the layer per area (area density), thus producing a specific setting of the resonant frequency/frequencies. On the other hand, the structures are preferably distributed so irregularly that diffraction effects are avoided.

Other features which are considered as characteristic for the invention are set forth in the appended claims.

Although the invention is illustrated and described herein as embodied in a thin film piezoelectric resonator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a sectional view of an exemplary embodiment of a resonator according to the invention;

FIG. 2 is a partial section showing an enlarged view of the detail 9 marked in FIG. 1; and FIG. 3 is a plan view showing the structure of the top layer.

DESCRIPTION OF PREFERRED EMBODIMENTS

Referring now to the figures of the drawing in detail and first, particularly, to FIG. 1 thereof, there is seen an exemplary resonator according to the invention, in cross section. A carrier film 2 is located on a substrate 1. The carrier film 2 is preferably formed of polysilicon. A cavity 4 in an auxiliary layer 3, for example made from oxide, is disposed below the carrier film 2. The cavity 4 is located in the region of a layer structure provided as resonator. The cavity typically has the illustrated dimension of approximately 200 μm. The layer structure of the resonator is located on the carrier film 2. The layer structure comprises a lower electrode layer 5 provided for the bottom electrode, a piezoelectric layer 6, and an upper electrode layer 7 provided for the cover electrode. The electrode layers 5, 7 are preferably metal, and the piezoelectric layer 6 is, for example, AlN, ZnO, or PZT ceramic (PbZrTi). This layer structure overall typically has the illustrated thickness of approximately 5 μm.

According to the invention, etching structures—preferably produced lithographically—are present in the upper electrode 7 or in a further layer applied thereto and denoted below as additional layer 8; these structures fix the resonant frequency or a plurality of different resonant frequencies in the way provided. In the example illustrated in FIG. 1, these etching structures are located in an additional layer 8.

The detail marked in FIG. 1 within the circle 9 is shown in FIG. 2 in an enlargement in which it is possible to see the structure of the additional layer 8 on the upper electrode layer 7 and on the piezoelectric layer 6. The additional layer 8 is perforated in this example by a multiplicity of holes 10. The effective mass loading of the resonator, and thus the resonant frequency, are specifically set via the density of the distribution of these holes 10. For a frequency of 1 GHz, the acoustic wavelength of current thin film piezoelectric materials is in the range from 5 μm to 10 μm. If the holes of the perforation and their spacing are substantially smaller than the acoustic wavelength, the perforation is fuzzy for the acoustic wave and therefore does not scatter the wave; the perforation acts on the wave as a change in the mean density of the material. A further advantage achieved is to scatter higher modes of the resonator at the holes, thereby reducing the undesired influence of these modes on the filter characteristic.

Referring now to FIG. 3, there is shown the additional layer 8 in plan view. The plan view shows the positioning of the holes 10 (approximately square here). Instead of individual holes in the additional layer 8, it is also possible to have contiguous interspaces which, for example, occupy the entire region between the square regions 10 illustrated in FIG. 3. These regions then form islands 10 made from the material of the additional layer 8. The essence of the structure present is that the cutout regions of the structured layer and/or the remaining islands are arranged such that the desired setting of the resonant frequency is achieved. If the structure is directly present in the upper electrode layer 7, it is advisable to leave all of this electrode layer 7 except for holes of approximately the size and arrangement as illustrated in FIG. 3 (holes 10).

When the resonator is being produced, fluctuations in the layer thickness can be evened out by specific and, if appropriate, (for example through the use of steppers) spatially varying overexposure or underexposure in the lithography. An arbitrary number of resonant frequencies can be implemented on the same chip without additional outlay with the aid of a plurality of resonators of appropriate design. During production, this requires merely a change in the spacing and the size of the holes in the mask used for the lithography. In particular, filters with parallel resonators and filter banks for separating frequency bands can be implemented easily in this way.

I claim:

1. A thin film piezoelectric resonator, comprising:
   a lower electrode layer and an upper electrode layer;
   a piezoelectric layer between said lower electrode layer and said upper electrode layer;
   an additional layer disposed on said upper electrode layer, said additional layer being structured with etching structures selected from the group consisting of holes and islands spaced at less than a wavelength of an operating wavelength of the resonator, for setting a prescribed resonant frequency of the piezoelectric resonator.

2. The resonator according to claim 1, wherein said structure is so irregular that diffraction phenomena are avoided.

3. The resonator according to claim 1, wherein said piezoelectric layer is formed of a material selected from the group consisting of AlN, ZnO, and PZT ceramic.

4. The resonator according to claim 3, which further comprises a carrier film formed of polysilicon formed below said lower electrode layer, said piezoelectric layer, and said upper electrode layer, and wherein a cavity is formed on a side of said carrier film averted from said lower electrode layer.

5. A piezoelectric resonator assembly, comprising a plurality of thin film piezoelectric resonators according to claim 1 formed on a common chip, said resonators being set to at least three different resonant frequencies.

* * * * *